United States Patent
Laub et al.

[11] 3,940,047
[45] Feb. 24, 1976

[54] BONDING APPARATUS UTILIZING PIVOTALLY MOUNTED BONDING ARM

[75] Inventors: Joseph L. Laub, Claremont; David W. Steinmeier, II, Temple City, both of Calif.

[73] Assignee: Unitek Corporation, Monrovia, Calif.

[22] Filed: Jan. 16, 1974

[21] Appl. No.: 433,662

[52] U.S. Cl. ............................................... 228/32
[51] Int. Cl.² ............................................ B23K 1/00
[58] Field of Search .......... 228/3, 25, 32; 29/470.1; 318/432, 433, 305; 51/165.77, 165.8, 99

[56] References Cited
UNITED STATES PATENTS

| | | | |
|---|---|---|---|
| 3,424,967 | 1/1969 | Keller | 318/432 |
| 3,543,989 | 12/1970 | Cooper | 228/25 |
| 3,601,930 | 8/1971 | Robillard | 51/165.8 |
| 3,664,567 | 5/1972 | Laub | 29/470.1 |
| 3,794,236 | 2/1974 | Salzer et al. | 29/470.1 |
| 3,828,439 | 8/1974 | Ishikawa et al. | 51/165.8 |

*Primary Examiner*—Al Lawrence Smith
*Assistant Examiner*—Robert C. Watson
*Attorney, Agent, or Firm*—Christie, Parker & Hale

[57] ABSTRACT

Apparatus for controlling the operation of a pivoted member. A pivoted arm such as provided in an apparatus for bonding leads in electronic components is controlled by means of a torque motor during bonding and non-bonding intervals to provide control of forces exerted by the pivoted member during the bonding interval and forces exerted on the pivoted member during non-bonding intervals. Motion cams to complement the operation of the torque motor may also be utilized.

9 Claims, 2 Drawing Figures

BONDING APPARATUS UTILIZING PIVOTALLY MOUNTED BONDING ARM

DESCRIPTION OF THE PRIOR ART

This invention relates to control mechanisms and in particular to a mechanism for controlling the excursions of a pivoted arm about its pivot point.

Apparatus for making electrical connections between the terminals of electronic devices and the connection pads of semiconductor dies in such devices take several forms. One such device, designated a thermocompression bonder, accomplishes the high-speed attachment of wire between interconnection points by means of diffusion bonds of the wire to the connection points. Such bonds are accomplished by moving a capillary tip mounted on a pivoted bonding arm to a specific location. Fine gold wire threaded through the tip is bonded by supplying heat and pressure through the tip to a gold ball formed at the end of the wire to produce a diffusion bond at that point. The capillary is then raised by the bonding arm to await the positioning of a second bonding location beneath the tip. When positioned and precisely aligned by a binocular microscope, the capillary is lowered to the interconnection point to accomplish a bond as before. The arm then raises the capillary and in normal operation returns it to a home position.

In one embodiment of a thermocompression bonder, the raising and lowering of the capillary is accomplished by the pivotal motion of the bonding arm on which the capillary is mounted about its pivot point under the influence of motion cams provided in the apparatus. Such an apparatus is described in U.S. Pat. No. 3,664,567. Within the general approach of utilizing motion cams to control the motion of a pivoted bonding arm, there are at least three specific configurations which are utilized to control the amount of force exerted by the capillary during bonding and non-bonding intervals. In a first configuration, a mass is movable along the bonding arm between the capillary and pivot point to control the amount of force exerted by the capillary at the instant of bonding. The disadvantage of this approach is that such a system is only capable of exerting a single bonding force, regardless of the different types of connection points and the different types of materials to which the connections are to be made in the course of typical bonding cycles.

In another configuration of prior art thermocompression (TC) bonders, a pivoted arm is provided with the capillary being located at one end. Two extension springs are operatively linked to the opposite end of the arm through cam yokes. The pivot point of the arm is located intermediate its ends and motion cams and cam yokes are provided and located such that the point of exertion of force by the motion cams is on the side of the pivot point opposite the capillary tip. In operation, rotation of the motion cam produces tension of the first of the two springs connected to the bonding arm to produce the first bonding force. For the second bond, the cams rotate further, producing tension of the second spring and further tension of the first spring to produce a second greater bonding force. The disadvantage of such an arrangement is that the two bond forces are not independent, rather the second bond force is always equal to to the sum of the force of the first bond plus that of the second. This means, in addition, that the second bond force can never be less than the first bonding force. Such a design also is subject to the disadvantage that the force exerted by the motion cam on the pivot arm when the cam is in other than the bonding positions is always that of the first bonding force. Finally, the extension springs are subject to change with age; the tension in such springs varies, and thus the bonding forces vary with time.

In still another configuration, a bonding arm is provided to which two lever arms are operatively linked to motion cams and operatively linked to one another. In this design, a plurality of motion cams are provided and each lever arm has a movable mass associated with it whereby adjustable bonding forces can be obtained by selected positioning of the mass along each of the respective lever arms. The second lever arm and the positioning of its associated mass is arranged such that the force exerted by this arm can be either additive or subtractive of the force exerted by the first mass. The operative engagement of the second arm with the first lever arm is controlled by the profile selected for the motion cam operatively engaged with the second lever arm. The disadvantage of such a system is that the bonding forces obtainable from such a system are limited to the number of lever arms provided, typically two, and the necessity of providing a solenoid to produce bond arm force causing the bonding arm to bear against a motion cam when the cam is not in either of the two bonding positions.

SUMMARY OF THE INVENTION

The present invention provides an improved bonding apparatus capable of providing a plurality of bonding forces, each bonding force being independent and being continuously adjustable within a spectrum of normally required bonding forces. The invention provides in an apparatus for bonding a member to a work location, the improvement comprising a bonding arm pivotably mounted in the apparatus, the arm having a bonding tool attached at one end thereof. Electromechanical means operatively linked to the bonding arm for applying a variable amount of force to the bonding arm is provided, the amount of force being applied by the electromechanical means being proportional to the electrical energy supplied to the electromechanical means. Input means electrically connected to the electromechanical means for controlling the amount of electrical energy to be supplied to the electromechanical means is also provided, the input means comprising a plurality of adjustable energizing electric current sources selectively connectible to the electromechanical means, the plurality of sources including a first source for controlling the amount of force applied to the bonding arm by the electromechanical means when the bonding tool is in contact with the bonding location.

In a preferred embodiment of the invention, the electrical means is a torque motor mounted in a fixed position with its rotor directly coupled to the bonding arm pivot shaft. A torque motor is a motor normally arranged to operate in a rotational or stalled mode whose output torque is in either mode proportional to its energizing current. When energizing current is applied to the torque motor, the bonding arm will rotate clockwise or counter-clockwise, depending upon the direction of the current. If the bonding arm is rotated toward the work stage, the capillary tip will exert a force on the work surface that is equal to the torque divided by the length of the bonding arm from the capillary tip to the pivot point. A DC motor with an appropriate current rating and a solenoid are also contemplated as substitutes for a torque motor as sources of variable mechanical force for supplying a selectable amount of bonding force.

The use of a torque motor also provides additional flexibility in bonder design in that the provision of motion cams is now made optional. If a motion cam is not utilized, the torque motor provides the bond arm rotational motion. If it is desired to utilize a motion cam to provide vertical bonding arm motion, the torque motor is then utilized to provide the force which maintains the bonding arm in physical contact with the motion cam.

In a typical operating sequence of a thermocompression bonder utilizing the improvement of the present invention, the bonding arm drops to a search position above each bond site. Location of the bond site beneath the capillary tip is accomplished by mechanical manipulators linked to the work stage, the bonding arm is lowered to cause a ball formed at the end of the wire extending out of the capillary tip to contact the bonding location, a bond is made at the site, and the arm is then raised to the search position and the operation is repeated. An automatic flame cutoff of the wire is made after the second bond to form a new ball. Each search and bond is actuated with a positive hand actuator, the operation of which is coordinated with and complemented by, in a preferred embodiment, a work stage micromanipulator. Process control is accomplished by programming the apparatus to control the polarity of the current supplied to the torque motor and to provide consistent and uniform flame cutoff, search levels, duration and heat during each cycle of operation. The process control for each package style for which electrical connections are to be made is accomplished by a current controller arrangement in which bonding forces are programmed by logic or manual-control inputs. The bonding force can be controlled in any mathematical manner, for example, linear, logarithmic, exponential, etc.

DESCRIPTION OF THE DRAWINGS

These and other advantages of the present invention will be better understood by reference to the figures of the drawing in which.

Figure 1:
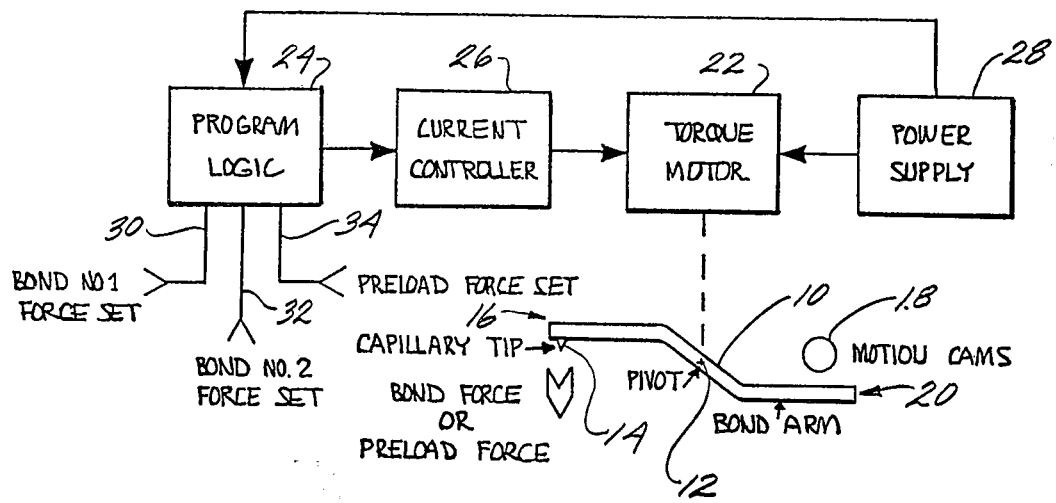
FIG. 1 is a block diagram of a bonder according to the present invention.

A block diagram of the apparatus according to the present invention is shown in FIG. 1. A bonding arm 10 for a bonding apparatus such as a TC bonder is pivotally mounted on a pivot shaft 12. Mounted at end 16 of arm 10 is a capillary tip 14. A motion cam 18 is positioned in operative relationship with respect to the bonding arm adjacent end 20 of the bonding arm. A torque motor 22 is mechanically linked to pivot shaft 12.

The blocks of FIG. 1 illustrate the functional modules of the control and energizing portions of the bonder as well as the torque motor. These include the program logic 24 which is connected to the current controller 26 which is in turn connected to the torque motor. A power supply 28 is connected to the torque motor and is also electrically connected to the program logic to provide electrical power to the logic and current controller circuitry which is in turn transmitted to the torque motor to cause it to exert a selected amount of torque (force) on pivot shaft 12.

The mechanical linkage of the torque motor to the bonding arm is accomplished by mounting the torque motor 22 in a fixed position and directly mechanically coupling its rotor to the bonding arm pivot shaft. The forces corresponding to the preload and bonding forces applied to the bonding arm are determined by the current supplied to the torque motor 22 from the current controller 26. The direction of rotation of the bonding arm is controlled by the direction of the energizing motor current.

As shown in FIG. 1, if the bonding arm is rotated in a counter-clockwise direction, the capillary tip will exert a force on a work surface that is equal to the torque (T) divided by the length of the bonding arm from the capillary tip to the pivot point. Thus, force $$(F) = \frac{\text{torque}(T)}{\text{length}(L)}.$$

The amount of torque is proportional to the energizing motor current (i) so that by substituting current for torque, the preceding expression can be stated:

$$F(\text{proportional}) \propto \frac{i}{L}.$$

In a preferred embodiment, the torque motor is a permanent magnet DC motor in which the torque generated by the motor is proportional to current supplied to the stator winding. The motor is capable of exerting controllable force in both the rotating and stalled modes. A suitably arranged AC motor can also be used, but a DC motor is preferred because of its linearity in operation. Because electric current is the controlling parameter, a current controller can be used. Contemplated for use in the system of the present invention are controller systems that are either open-looped or closed-loop for precise force control. The forces to be exerted by the bonding arm can be programmed into the apparatus by appropriate logic circuitry or in alternative, by manual control inputs.

As shown in FIG. 1, a logic circuit is used. For illustration purposes, the system shown therein is capable of exerting three forces, two bonding forces and a preload force. In actuality, the number of different forces available is limited only by the size of the programming logic or number of manual controls. The force can be controlled by the controller system in any mathematical manner, for example, by means of linear control, logarithmic control, or exponential control. A control signal at input 30 causes bond force number 1 to be exerted by the torque motor, bond force number 2 is selected responsive to a signal at input 32 and a preload force is triggered by a signal at input 34.

Figure 2:
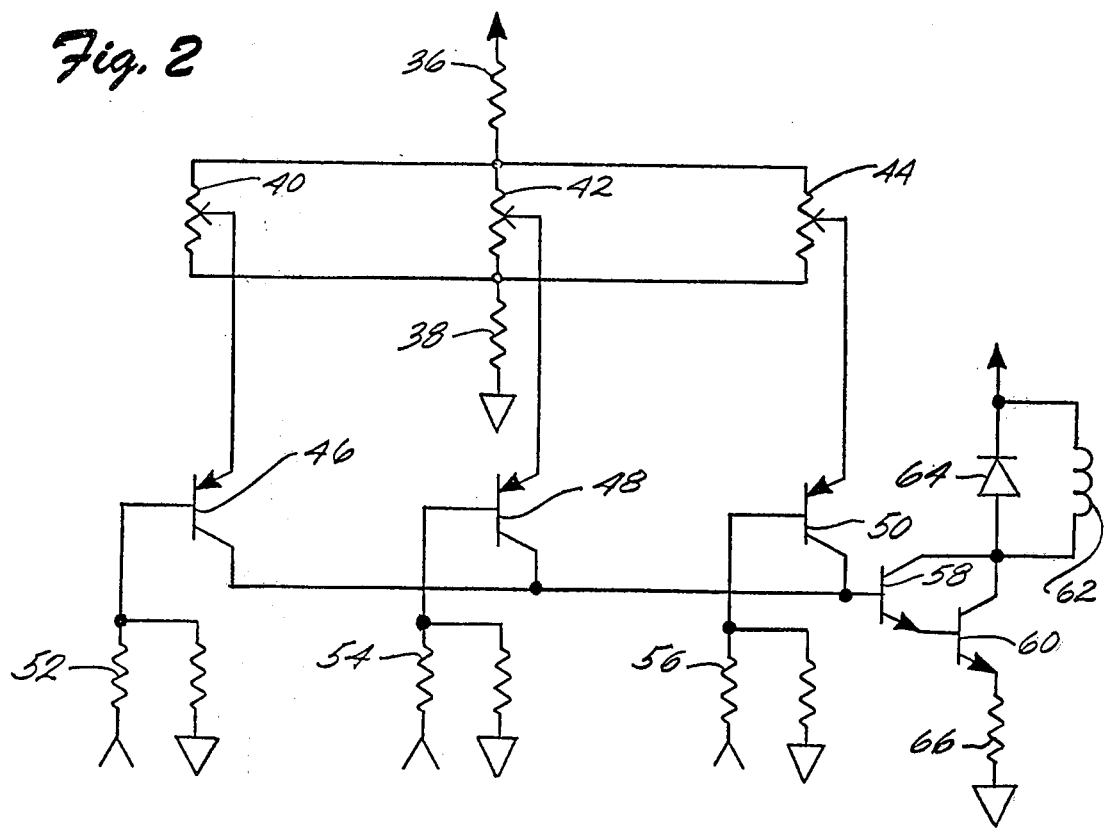
FIG. 2 is a schematic diagram of the program logic and current controller circuitry.

The circuit of FIG. 2 is a schematic diagram of the program logic 24 and current controller 26 of FIG. 1. In the circuit of FIG. 2, resistor 36 is a voltage-dropping resistor which limits the maximum amount of torque available from the torque motor. Likewise, resistor 38 is a voltage-dropping resistor which limits the minimum amount of torque obtainable from the torque motor. Potentiometers 40, 42, and 44 are torque selection controls and correspond respectively to the potentiometer for selecting the first bonding force, second bonding force, and preload force. Each of said potentiometers are adjusted to obtain the precise magnitude of force desired to be exerted by the torque motor. Transistors 46, 48, and 50 are switching transistors that are activated by logic input signals through resistors 52, 54, and 56 respectively. As control signals from the bonding apparatus are generated corresponding to the particular force to be exerted on the bonding arm, a respective one of said switching transistors is activated and energy is supplied from the power supply through the potentiometer corresponding to the transistor switch which is "on." Transistor 58 is a Darlington input transistor for power transistor 60 which controls the current supplied to the torque motor schematically represented by winding 62. A reverse transient suppression diode 64 is connected across winding 62 and the emitter of power transistor 60 is connected to ground through a reference current control resistor 66.

As input signals are received from the bonding apparatus corresponding to bond one, bond two, and the interval between bonds, namely, the preload force, the various switching transistors are turned on and off to control the current supplied through resistor 36 and potentiometers 40, 42, 44 to winding 62 and to thereby control the amount of torque exerted by the torque motor on the bonding arm.

The advantage of the present invention is that completely independent forces are produced not dependent upon mechanical linkages which are limited in flexibility and in which forces exerted on the bonding arm are not completely independent. Quick and easy adjustment over the entire spectrum of force magnitudes available from the torque is obtained by the use of potentiometer adjustments. The flexibility of the apparatus is further enhanced, since the sequence of force application is logic controllable. Use of a torque motor or, as the ensuing discussion will indicate, other electrical means for controlling the amount of force exerted on the bonding arm minimizes the number of mechanical moving parts that are used by the bonder. Likewise consistently repeatable forces are supplied by the electrical means such as the torque motor, forces which are not subject to variation with the age of the apparatus due to metal fatigue or other mechanical variations.

In addition to a torque motor, it is contemplated that a conventional DC motor with a current rating capable of handling the stall current needed to generate the desired torque can also be used as the electrical means for applying a variable force proportional to energizing current.

In still another embodiment, a solenoid in which the output force is proportional to its energizing current can be utilized. In this embodiment the solenoid acts directly in a straight line motion on the bonding arm, in contrast to the motors which are linked to the pivot shaft on which the bonding arm is mounted. In these alternate embodiments the control circuitry remains the same.

In an alternate to the embodiment shown in FIG. 1 a bonding apparatus according to the present invention can be provided without the utilization of motion cams. In this alternate, the torque motor itself is used to provide the rotational motion for the bonding arm as well as to generate the bonding force. This is in contrast to the arrangement in FIG. 1 where the motion cams control the vertical motion of the bonding arm and the torque motor exerts a force, designated a preload force, to keep the bonding arm in physical contact with the motion cams in between the bonding intervals, thereby enhancing control and speed of operation of the bonding apparatus. To reverse the rotation of the torque motor in this alternate arrangement, the circuitry of FIG. 2 is also modified to enable current to be directed through winding 62 in the opposite direction.

What is claimed is:

1. In a bonding apparatus, the improvement comprising
   a bonding arm having a bonding tool attached at one end thereof;
   electromechanical means operatively linked to the bonding arm for applying a variable amount of force to the bonding arm, the amount of force applied being proportional to the electrical energy supplied to the electromechanical means;
   input means electrically connected to the electromechanical means for controlling the amount of electrical energy to be supplied to the electromechanical means, the input means comprising a plurality of adjustable energizing electric current sources selectively connectable to the electromechanical means, the plurality of sources including a first source for controlling the amount of force applied to the bonding arm by the electromechanical means when the bonding tool is in contact with a bonding location.

2. An improved apparatus according to claim 1 wherein the plurality of current sources includes a second source for controlling the amount of force applied to the bonding arm by the electromechanical means when the bonding tool is not in contact with the bonding location.

3. An improved apparatus according to claim 1 including programming means connected to the input means for selecting different amounts of electric energy to be supplied to the electromechanical means during a cycle of operation of the bonding apparatus whereby the amount of force exerted by the bonding tool at the bonding location is controlled.

4. An improved apparatus according to claim 3 including cam means operatively linked to the bonding arm, the operation of said cam means being responsive to the programming means.

5. An improved apparatus according to claim 4 wherein the input means supply a first amount of energy determined by the programming means for applying a first force to the bonding arm when the bonding tool is in contact with a bonding location and a second amount of energy determined by the programming means for applying a second force to the bonding arm during the interval of contact with the cam means when the bonding tool is not in contact with the bonding location.

6. An improved apparatus according to claim 5 wherein the input means responsive to the programming means supply at least three discrete amounts of energy during each cycle of bonding apparatus operation, said amounts of energy being supplied to the electromechanical means producing, respectively, a first force on the bonding arm corresponding to a first bond, a second force on the bonding arm corresponding to a second bond and a third force corresponding to a preload force on the bonding arm during the nonbonding portion of each cycle of the bonding apparatus operation.

7. An apparatus according to claim 1 wherein the electromechanical means is a torque motor.

8. An apparatus according to claim 1 wherein the electromechanical means is a D. C. motor having a predetermined electric current rating such that it can receive electric currents during stalling of a magnitude needed to generate a variable amount of torque without affecting the operating characteristics of the motor.

9. An apparatus according to claim 1 wherein the electromechanical means is a solenoid.

* * * * *